(12) United States Patent
Takamatsu et al.

(10) Patent No.: US 8,043,481 B2
(45) Date of Patent: Oct. 25, 2011

(54) SPUTTERING METHOD AND APPARATUS

(75) Inventors: Yasutake Takamatsu, Higashine (JP);
Katsunori Takahashi, Higashine (JP);
Shin-ichiro Matsuo, Higashine (JP)

(73) Assignee: Showa Denko K.K., Tokyo (JP)

( * ) Notice: Subject to any disclaimer, the term of this patent is extended or adjusted under 35 U.S.C. 154(b) by 568 days.

(21) Appl. No.: 12/276,087

(22) Filed: Nov. 21, 2008

(65) Prior Publication Data
US 2009/0294278 A1 Dec. 3, 2009

(30) Foreign Application Priority Data

May 28, 2008 (JP) .................................. 2008-140120

(51) Int. Cl.
*C23C 14/34* (2006.01)

(52) U.S. Cl. ......... 204/192.12; 204/192.13; 204/298.03; 204/298.2

(58) Field of Classification Search ............. 204/192.12, 204/192.13, 298.03, 298.2
See application file for complete search history.

(56) References Cited

U.S. PATENT DOCUMENTS

| 5,252,194 | A | * | 10/1993 | Demaray et al. | ............ | 204/298.2 |
| 5,554,249 | A | * | 9/1996 | Hasegawa et al. | ........ | 156/345.47 |
| 5,770,025 | A | * | 6/1998 | Kiyota | ........................ | 204/298.2 |
| 6,190,495 | B1 | * | 2/2001 | Kubota et al. | ............. | 156/345.46 |
| 6,436,252 | B1 | * | 8/2002 | Tzatzov et al. | ........... | 204/298.22 |
| 6,533,907 | B2 | * | 3/2003 | Demaray et al. | ......... | 204/192.25 |

FOREIGN PATENT DOCUMENTS

| JP | A 4-63271 | 2/1992 |
| JP | A 4-63273 | 2/1992 |
| JP | A 11-61401 | 3/1999 |
| JP | A 2000-1776 | 1/2000 |

* cited by examiner

*Primary Examiner* — Christopher Young
(74) *Attorney, Agent, or Firm* — Greer, Burns & Crain, Ltd

(57) ABSTRACT

A sputtering method deposits a film on a substrate by controlling a magnetic field parallel to a surface of a target so that the magnetic field at a part of the target, other than parts of the target which are sputtered during a deposition mode in which a deposition process is performed with respect to the substrate, has an intensity lower than an arbitrary intensity at the other parts during the deposition mode and has an intensity higher than or equal to the arbitrary intensity during a standby mode in which the deposition process is not performed. A redeposited film which is deposited on the part of the target during the deposition mode is removed by performing a sputtering during the standby mode.

14 Claims, 10 Drawing Sheets

SPUTTERING METHOD AND APPARATUS

BACKGROUND OF THE INVENTION

1. Field of the Invention

The present invention generally relates to sputtering methods and apparatuses, and more particularly to a sputtering method and a sputtering apparatus which are suited for magnetron sputtering and the like.

2. Description of the Related Art

FIG. 1 is a diagram for explaining a conventional sputtering method. In FIG. 1, magnets 2 and 3, which are provided on a magnet base 1, are rotated with respect to a target 8 by a motor (not shown). A peripheral part of the target 8 is held by a target holder 9 within a vacuum chamber of a sputtering apparatus.

During sputtering within the vacuum chamber of the sputtering apparatus, sputtering atoms 11 reach a substrate (not shown) on which a desired film is to be sputtered. In this process of reaching the substrate, a portion of the sputtering atoms 11 become redepositing atoms 12 which are redeposited on the surface of the target 8 due to scattering of a process gas such as Ar gas, to thereby form a redeposited film on the surface of the target 8. On the other hand, a sputtering rate at the surface of the target 8 has a distribution which is mainly dependent upon an intensity of a magnetic field parallel to the surface of the target 8. In FIG. 1, a dotted line indicates the magnetic field, and a one-dot chain line indicates the magnetic field intensity. As a result, a volume of the redeposited film which is formed on the surface of the target 8 is determined by a balance between the sputtering rate and a deposition rate of the redeposited film.

In general, a magnetic circuit used in magnetron sputtering, more particularly, a rotary cathode magnet, is designed to have a weak magnetic field intensity at the peripheral part of the target 8 in order not to subject parts other than the target 8, such as the target holder 9, to the sputtering. For this reason, the deposition rate of the redeposited film becomes high with respect to the sputtering rate at the peripheral part of the target 8, and this causes the deposition of the redeposited film.

FIG. 2 is a diagram showing a relationship between the sputtering rate and the deposition rate of the redeposited film at a location where the intensity of the magnetic field parallel to the target surface (that is, the surface of the target 8) is strong. In addition, FIG. 3 is a diagram showing the relationship between the sputtering rate and the deposition rate of the redeposited film at a location where the intensity of the magnetic field parallel to the target surface is weak. In FIGS. 2 and 3, SQ denotes a sputtering amount (or quantity) of the sputtering atoms 11, and RD denotes a redeposition amount (or quantity) of the redepositing atoms 12. In the case shown in FIG. 3, the redeposition amount RD is large compared to the sputtering amount SQ.

If the deposition amount RD of the redepositing atoms 12 or, the film thickness of the redeposited film becomes greater than or equal to a predetermined value, a delamination of the redeposited film easily occurs due to changes in thermal stress and the like. When the delamination of the redeposited film occurs, a component of the redeposited film may adhere on the substrate to cause a defect or, a cathode may be short-circuited to the ground within the vacuum chamber and cause an operation failure of the sputtering apparatus.

Various kinds of sputtering apparatuses have been proposed, as may be seen from Japanese Laid-Open Patent Applications No. 11-61401, No. 2000-1776, No. 4-63271 and No. 4-63273, for example.

According to the conventional sputtering method, there was a problem in that the deposition amount of the redeposited film becomes large at the peripheral part of the target where the intensity of the magnetic field parallel to the target surface is weak, and the delamination of the redeposited film easily occurs.

SUMMARY OF THE INVENTION

Accordingly, it is a general object of the present invention to provide a novel and useful sputtering method and apparatus, in which the problems described above are suppressed.

Another and more specific object of the present invention is to provide a sputtering method and a sputtering apparatus, which can reduce a redeposition amount of a redeposited film on a target.

According to one aspect of the present invention, there is provided a sputtering method for depositing a film on a substrate, comprising controlling a magnetic field parallel to a surface of a target so that the magnetic field at a part of the target, other than parts of the target which are sputtered during a deposition mode in which a deposition process is performed with respect to the substrate, has an intensity lower than an arbitrary intensity at the other parts during the deposition mode and has an intensity higher than or equal to the arbitrary intensity during a standby mode in which the deposition process is not performed; and removing a redeposited film which is deposited on the part of the target during the deposition mode by performing a sputtering during the standby mode. According to this aspect of the present invention, it is possible to reduce a redeposition amount of the redeposited film on the target.

According to another aspect of the present invention, there is provided a sputtering apparatus for depositing a film on a substrate, comprising a target holder configured to hold a target, which has a disk shape, within a vacuum chamber; a rotatable magnet base having first, second and third magnets which are configured to generate a magnetic field and are arranged from an outer periphery towards an inner periphery of the disk shape; and a control unit configured to control a magnetic field parallel to a surface of the target so that the magnetic field at a part of the target, other than parts of the target which are sputtered during a deposition mode in which a deposition process is performed with respect to the substrate, has an intensity lower than an arbitrary intensity at the other parts during the deposition mode and has an intensity higher than or equal to the arbitrary intensity during a standby mode in which the deposition process is not performed, wherein a redeposited film which is deposited on the part of the target during the deposition mode is removed by performing a sputtering during the standby mode. According to this aspect of the present invention, it is possible to reduce a redeposition amount of the redeposited film on the target.

According to another aspect of the present invention, there is provided a sputtering apparatus for depositing a film on a substrate, comprising a target holder configured to hold a target, which has a disk shape, within a vacuum chamber; a rotatable magnet base having first and second magnets which are configured to generate a magnetic field and are arranged from an outer periphery towards an inner periphery of the disk shape; and a control unit configured to control a magnetic field parallel to a surface of the target so that the magnetic field at a part of the target, other than parts of the target which are sputtered during a deposition mode in which a deposition process is performed with respect to the substrate, has an intensity lower than an arbitrary intensity at the other parts during the deposition mode and has an intensity higher than or equal to the arbitrary intensity during a standby mode in which the deposition process is not performed, wherein a redeposited film which is deposited on the part of the target during the deposition mode is removed by performing a sputtering during the standby mode. According to this aspect of the present invention, it is possible to reduce a redeposition amount of the redeposited film on the target.

Other objects and further features of the present invention will be apparent from the following detailed description when read in conjunction with the accompanying drawings.

DESCRIPTION OF THE PREFERRED EMBODIMENTS

According to one embodiment of the sputtering method and apparatus, an intensity of a magnetic field parallel to a target surface at a part of a target where the magnetic field is weak during an operating state or a producing state is controlled to be strong during an idle state or a non-producing state, in order to sputter the part of the target not sputtered during the operating state or the producing state and to remove a redeposited film. The redeposited film that is removed during the idle state or the non-producing state is exhausted outside the sputtering apparatus by an exhaust process or the like performed before the actual operation or production. Hence, it is possible to prevent the removed redeposited film from affecting the film deposition on a substrate during the actual operation or production.

A description will now be given of embodiments of the sputtering method and apparatus according to the present invention, by referring to FIG. 4 and the subsequent figures.

Figure 4:
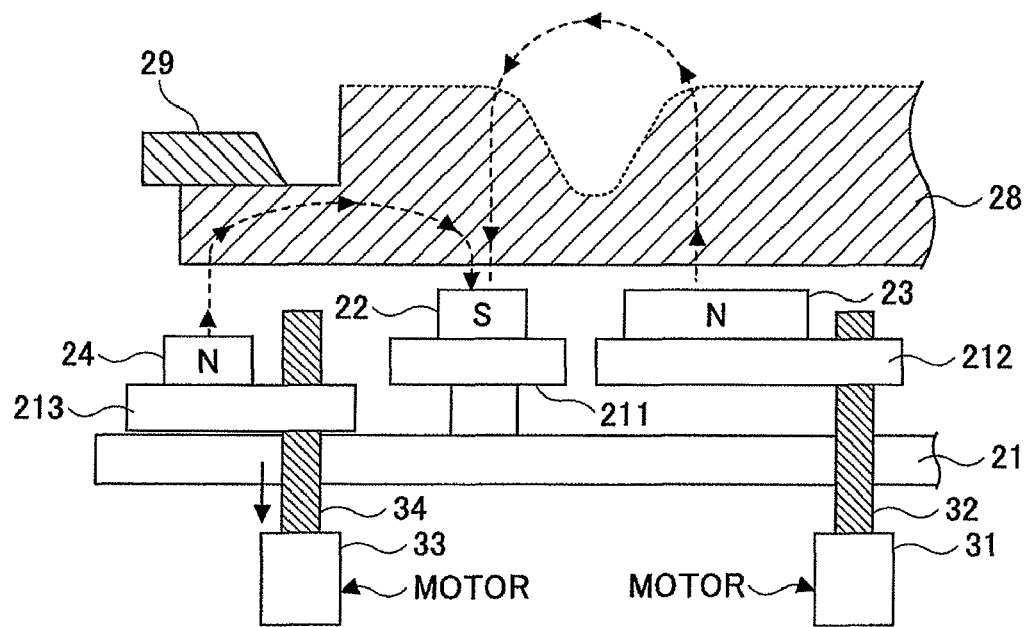
FIG. 4 is a diagram for explaining an operation during an operating state in a first embodiment of the present invention.

FIG. 4 is a diagram for explaining an operation of the sputtering apparatus during an operating state or producing state (hereinafter simply referred to as an actual operation) in a first embodiment of the present invention. In FIG. 4, a first support part 211, a second support part 212 and a third support part 213 are provided on a magnet base 21. The first support part 211 supports a magnet 22, the second support part 212 supports a magnet 23, and the third support part 213 supports a magnet 24. Each of the magnets 22, 23 and 24 is formed by a permanent magnet. The first support part 211 is fixed on the magnet base 21. On the other hand, the second support part 212 is movable by a motor 31 and a moving mechanism 32, and is provided in a movable manner with respect to the magnet base 21 and a target 28. In addition, the third support part 213 is movable by a motor 33 and a moving mechanism 34, and is provided in a movable manner with respect to the magnet base 21 and the target 28. The second and third support parts 212 and 213 are movable independent of each other. The magnet base 21 is rotated by a motor (not shown) with respect to the target 28. An outer peripheral part of the target 28 is held by a target holder (or shield) 29 within a vacuum chamber of the sputtering apparatus.

In FIG. 4, a dotted line indicates the magnetic field. Further, the magnets 24, 22 and 23 have the N and S poles arranged in a sequence N, S and N in FIG. 4, but the magnets 24, 22 and 23 may have the N and S poles arranged in a reverse sequence S, N and S.

In this embodiment, the target 28 has a disk shape, and the magnets 24, 22 and 23 are arranged in this order from an outer periphery towards an inner periphery of the disk shape.

During the actual operation (operating state) of the sputtering apparatus, a desired film is formed on a substrate (not shown), which is to be used for a product such as a magnetic recording medium, by sputtering. In this case, the sputtering is made using the magnetic field generated by the magnets 22 and 23, and for this reason, a control unit (not shown) controls the motor 31 to move the second support part 212 to a raised position shown in FIG. 4 in order to move the magnet 23 close to the target 28. On the other hand, the control unit controls the motor 33 to move the third support part 213 to a lowered position shown in FIG. 4 in order to move the magnet 24 away from the target 28. As a result, the magnetic field generated by the magnets 24 and 22 is suppressed to an intensity such that the magnetic field does not leak from the target 28, and no sputtering will be generated by the magnetic field of the magnets 24 and 22. Although FIG. 4 shows a case where the magnetic field generated by the magnets 24 and 22 passes through the target 28, the magnet 24 may be moved away from the target 28 to such an extent that the magnetic field generated by the magnets 24 and 22 will not leak from and will not pass through the target 28.

Figure 1:
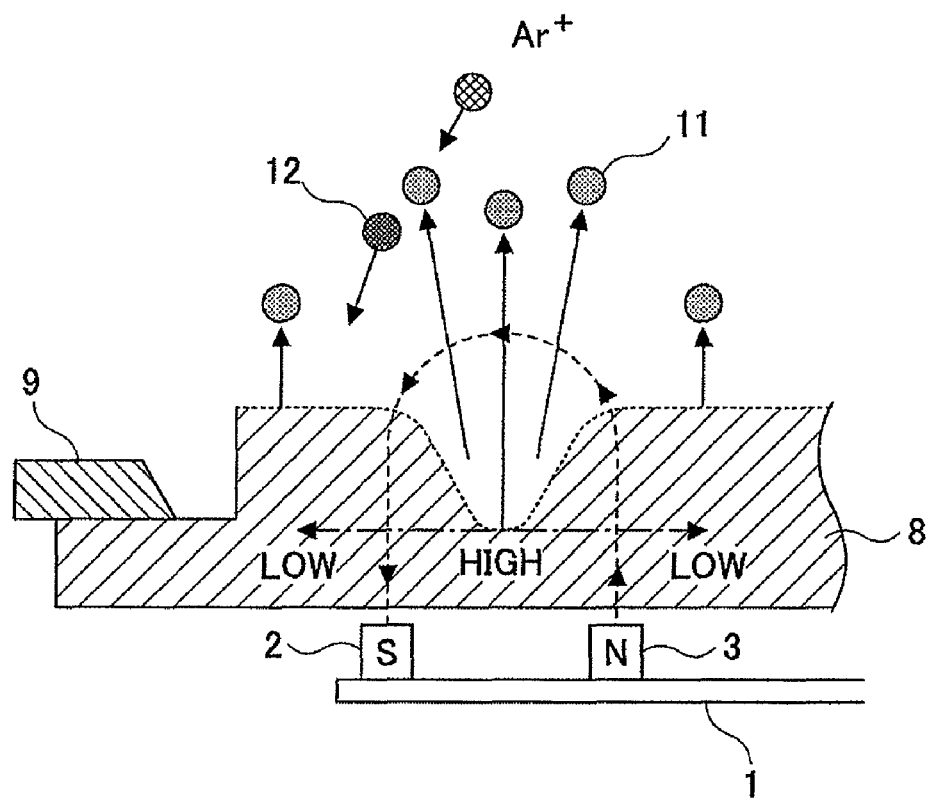
FIG. 1 is a diagram for explaining a conventional sputtering method.
Figure 2:
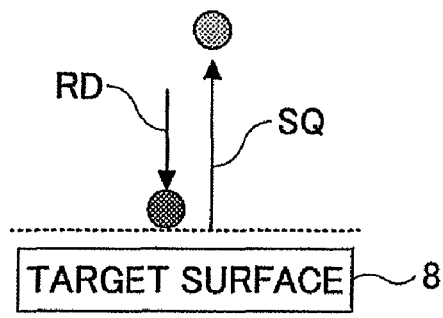
FIG. 2 is a diagram showing a relationship between a sputtering rate and a deposition rate of a redeposited film at a location where an intensity of a magnetic field parallel to a target surface is strong.
Figure 3:
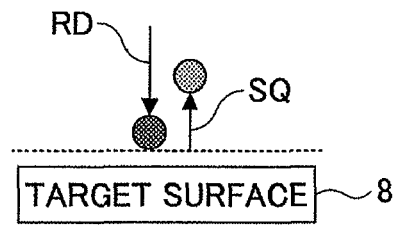
FIG. 3 is a diagram showing the relationship between the sputtering rate and the deposition rate of the redeposited film at a location where the intensity of the magnetic field parallel to the target surface is weak.
Figure 5:
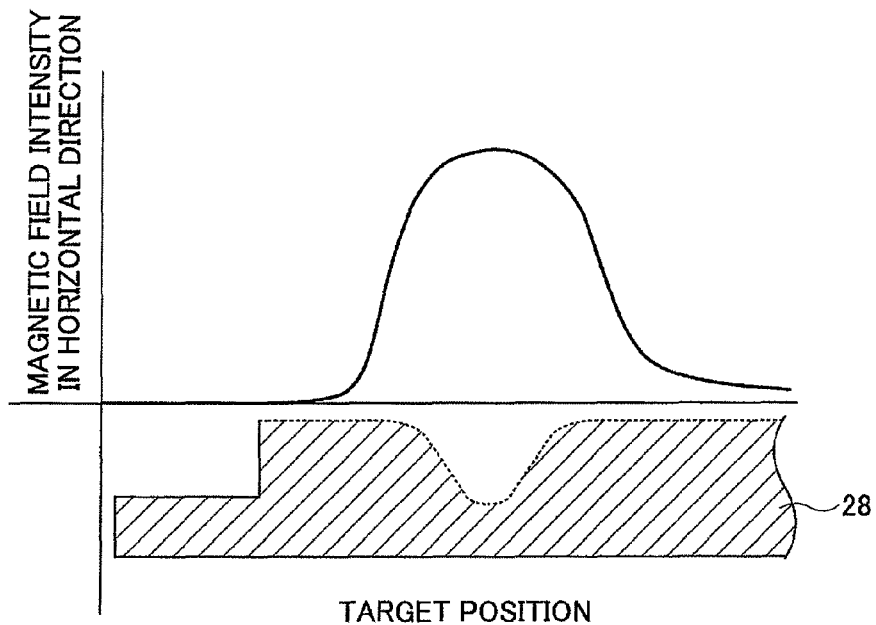
FIG. 5 is a diagram showing an intensity of the magnetic field parallel to the target surface during the operating state.

FIG. 5 is a diagram showing an intensity of the magnetic field parallel to a surface of the target 28 (that is, the target surface) during the operating state. In FIG. 5, the ordinate indicates the magnetic field intensity in the horizontal direction in arbitrary units, and the abscissa indicates the position of the target 28 in arbitrary units. The left side of FIG. 5 corresponds to the outer peripheral part of the target 28. As may be seen from FIG. 5, the magnetic field contributing to the sputtering during the operating state is generated by the magnets 22 and 23, and the magnetic field generated by the magnets 24 and 22 does not contribute to the sputtering because the magnetic field generated by the magnets 24 and 22 does not leak from the target 28. For this reason, the parts at the outer peripheral part of the target 28 and other than the target 28, such as the target holder 29, will not be subjected to the sputtering. In addition, when the magnetic field generated by the magnets 24 and 22 passes the target 28 as shown in FIG. 4, the deposition rate of the redepositing film with respect to the sputtering rate at the outer peripheral part of the target 28, including the target holder 29, becomes low compared to that of the conventional case shown in FIG. 1, and it is possible to suppress the deposition of the redepositing film.

Figure 6:
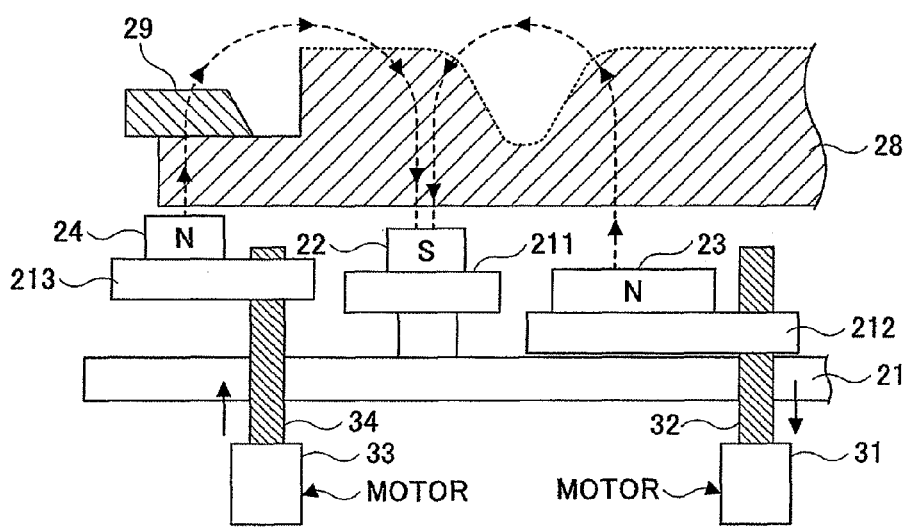
FIG. 6 is a diagram for explaining an operation during an idle state in the first embodiment of the present invention.

FIG. 6 is a diagram for explaining an operation during an idle state or a non-producing state (hereinafter simply referred to as the idle state) in the first embodiment of the present invention.

During the idle state of the sputtering apparatus, the desired film is not formed on the substrate which is to be used for the product by the sputtering, however, it is possible to form the desired film on a dummy substrate or the like by the sputtering. In this case, to make the intensity of the magnetic field generated by the magnets 22 and 23 lower than that during the actual operation (operating state), the control unit controls the motor 31 to move the second support part 212 to a lowered position shown in FIG. 6 in order to move the magnet 23 away from the target 28. On the other hand, the control unit controls the motor 33 to move the third support part 213 to a raised position shown in FIG. 6 in order to move the magnet 24 close to the target 28. As a result, the intensity of the magnetic field generated by the magnets 24 and 22 is controlled to an intensity greater than or equal to the intensity of the magnetic field generated by the magnets 22 and 23, to thereby perform a sputtering by the magnetic field generated by the magnets 24 and 22. In this state, the sputtering performed by the magnetic field generated by the magnets 22 and 23 is suppressed to a minimum. By the sputtering performed by the magnetic field generated by the magnets 24 and 22, it is possible to remove the redepositing film which is deposited on the outer peripheral part of the target 28 and the parts other than the target 28, such as the target holder 28. In addition, because the outer peripheral part of the target 28, which is not sputtered much during the operating state, is sputtered by the magnetic field generated by the magnets 24 and 22, it is possible to more uniformly utilize the surface of the target 28 compared to the conventional case shown in FIG. 1.

Figure 7:
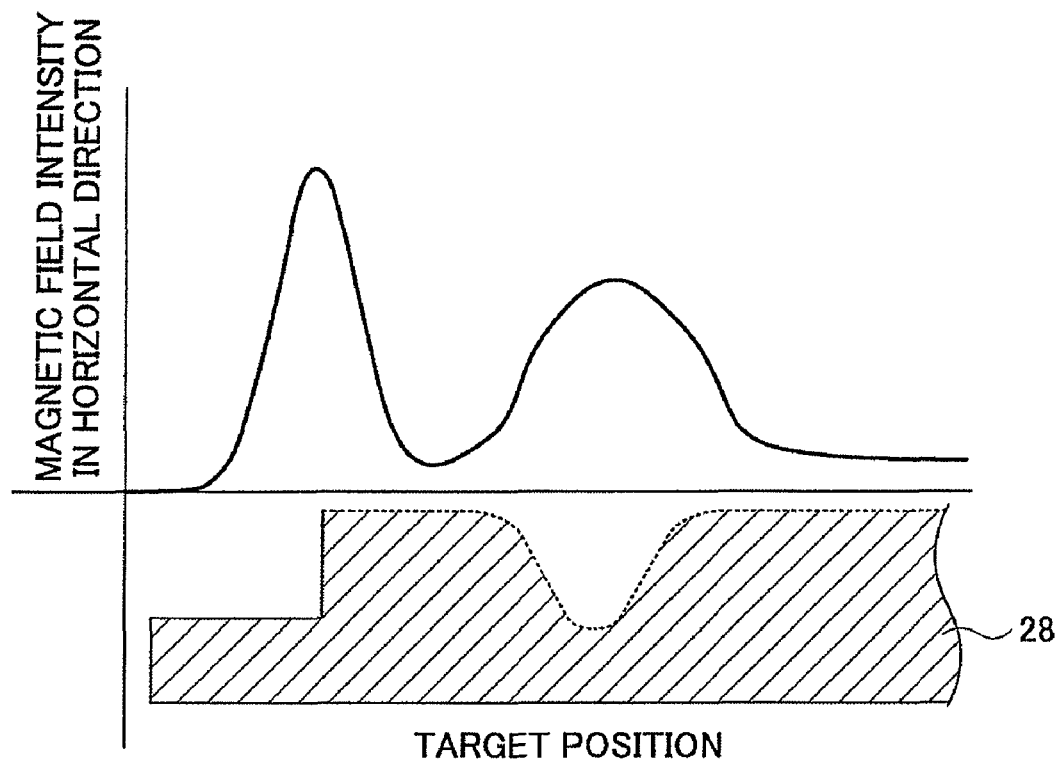
FIG. 7 is a diagram showing an intensity of the magnetic field parallel to the target surface during the idle state.

FIG. 7 is a diagram showing an intensity of the magnetic field parallel to the target surface during the idle state. In FIG. 7, the ordinate indicates the magnetic field intensity in the horizontal direction in arbitrary units, and the abscissa indicates the position of the target 28 in arbitrary units. The left side of FIG. 7 corresponds to the outer peripheral part of the target 28. As may be seen from FIG. 7, the magnetic field which contributes to the sputtering during the idle state is mainly generated by the magnets 24 and 22, and the magnetic field generated by the magnets 22 and 23 does not contribute much to the sputtering when compared to the operating state. For this reason, the outer peripheral part of the target 28 and the parts other than the target 28, such as the target holder 28, are sputtered during the idle state. Consequently, it is possible to remove the redepositing film which is deposited during the operating state on the peripheral part of the target 28 and the parts other than the target 28, such as the target holder 28. The redepositing film that is removed during the idle state is exhausted outside the sputtering apparatus by the exhaust process or the like performed before the subsequent operating state, and will not affect the deposition on the substrate during the subsequent operating state.

Figure 8:
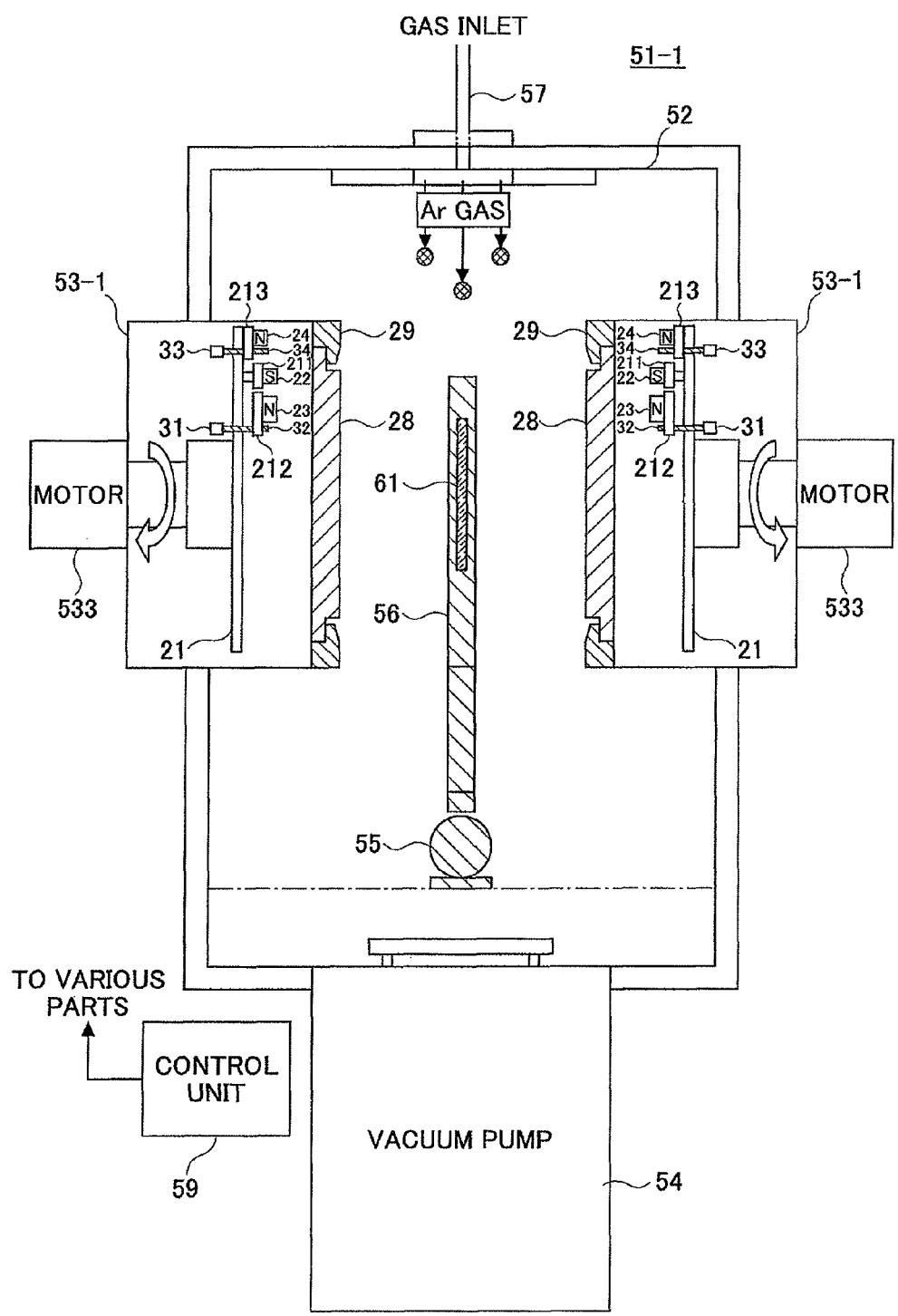
FIG. 8 is a cross sectional view showing a sputtering apparatus in the first embodiment of the present invention.

FIG. 8 is a cross sectional view showing the sputtering apparatus in the first embodiment of the present invention. A sputtering apparatus 51-1 shown in FIG. 8 performs a magnetron sputtering using a rotary cathode magnet. In FIG. 8, those parts that are the same as those corresponding parts in FIGS. 4 and 6 are designated by the same reference numerals, and a description thereof will be omitted. In this example, two targets 28 are used.

The sputtering apparatus 51-1 shown in FIG. 8 includes a vacuum chamber 52 with two rotary cathode magnet parts 53-1, and a vacuum pump 54. The two rotary cathode magnet parts 53-1 have the same structure, and includes a motor 533 which rotates a magnet base 22.

A carrier 56 which supports a substrate 61 is provided within the vacuum chamber 52, and the carrier 56 is transported by a transport unit 55. The transport unit 55 transports the substrate 61 on which a desired film is to be deposited from outside the vacuum chamber 52 to the inside of the vacuum chamber 52, and transports the substrate 61 from the inside of the vacuum chamber 52 to the outside of the vacuum chamber 52 after the desired film is deposited on the substrate 61. A gas inlet 57 is provided to introduce a process gas, such as Ar gas, to the vacuum chamber 52.

A control unit 59 controls various parts of the sputtering apparatus 51-1. For the sake of convenience, the illustration of signal lines from the control unit 59 to the various parts of the sputtering apparatus 51-1 is omitted. The control unit 59 controls motors 31, 33 and 533, the transport unit 55, the vacuum pump 54, the introduction of the process gas via the gas inlet 57 to the vacuum chamber 52, the exhaust from the vacuum chamber 52 via an exhaust outlet, and the like. In this embodiment, the control unit 59 is formed by a single processor which controls the entire sputtering apparatus 51-1. However, in a case where the control unit 59 is formed by a plurality of processors, it is possible to control the various parts of the sputtering apparatus 51-1 by separate processors.

Figure 9:
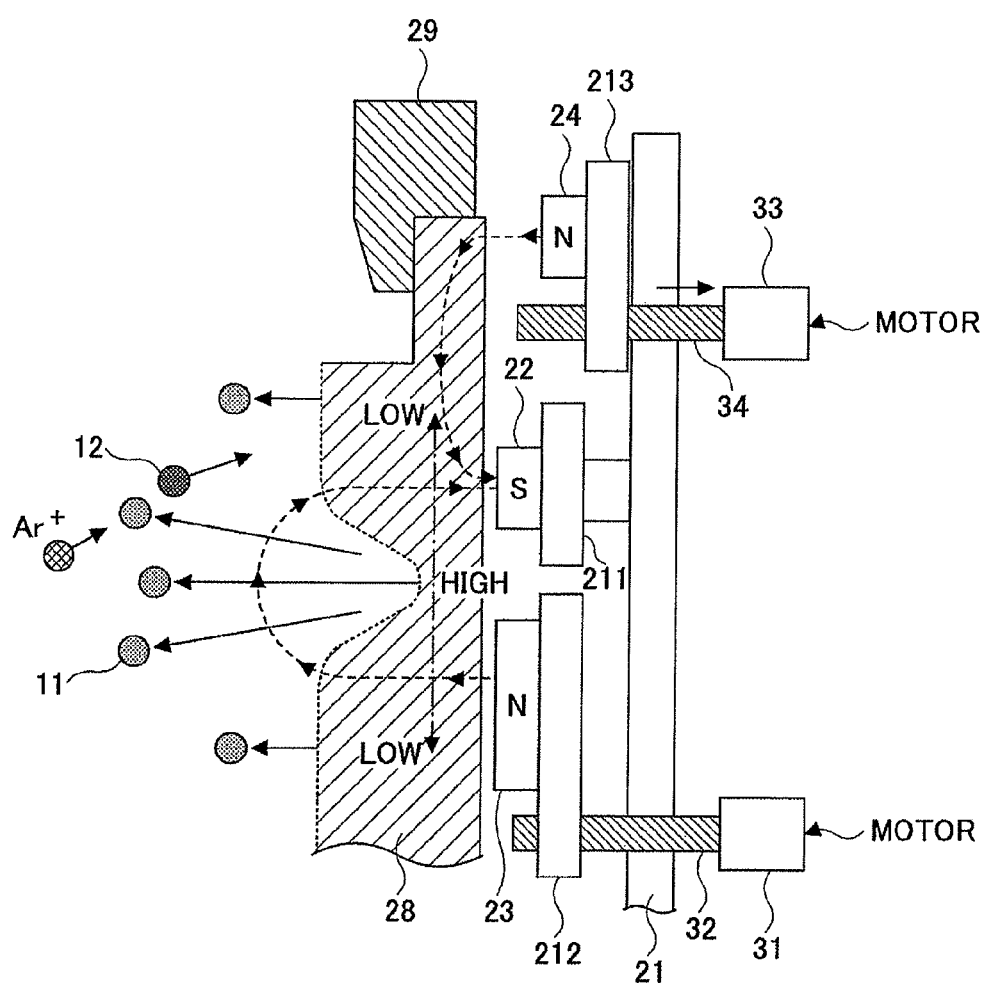
FIG. 9 is a diagram showing a target part of FIG. 8 on an enlarged scale.

FIG. 9 is a diagram showing a target part in the right rotary cathode magnet part 53-1 of FIG. 8 on an enlarged scale. When the sputtering is performed within the vacuum chamber 52 during the operating state of the sputtering apparatus 51-1, sputtering atoms 11 reach the substrate 61 on which a desired film is to be sputtered. In this process of reaching the substrate 61, a portion of the sputtering atoms 11 become redepositing atoms 12 which are redeposited on the surfaces of the target 28 and the target holder 29 due to the scattering of the process gas such as Ar gas, to thereby form a redeposited film on the surfaces of the target 28 and the target holder 29. On the other hand, the sputtering rate at the surface of the target 28 has a distribution which is mainly dependent upon the intensity of the magnetic field parallel to the surface of the target 28. In FIG. 9, a dotted line indicates the magnetic field, and a one-dot chain line indicates the magnetic field intensity. As a result, a volume of the redeposited film which is formed on the surfaces of the target 28 and the target holder 29 is determined by a balance between the sputtering rate and the deposition rate of the redeposited film.

In this embodiment, even if the redepositing film is deposited on the surfaces of the target 28 and the target holder 29 during the operating state, the redeposited film is removed during the idle state of the sputtering apparatus 51-1. Because the redeposited film is removed, it is possible to prevent delamination of the redeposited film. By preventing the delamination of the redeposited film, it is possible to prevent a component of the redeposited film from adhering on the substrate 61 to cause a defect or, to prevent a cathode from becoming short-circuited to the ground within the vacuum chamber 52 and cause an operation failure of the sputtering apparatus 51-1.

During the idle state, the sputtering apparatus 51-1 is not turned OFF completely and a minimum sputtering is continued for the following reasons. When continuously depositing films on a plurality of substrates, it takes time to put the sputtering apparatus from a completely OFF state to the ON state (that is, the operating state) every time the substrate is changed, and the productivity greatly deteriorates. Hence, the sputtering apparatus 51-1 of this embodiment has two operation modes, namely, a deposition mode (that is, the operating state) for carrying out the actual deposition process with respect to the substrate 61, and a standby mode (that is, the idle state) which does not perform the deposition process with respect to the substrate 61 but continues the minimum sputtering so as not to put the sputtering apparatus 51-1 to the completely OFF state.

Figure 10:
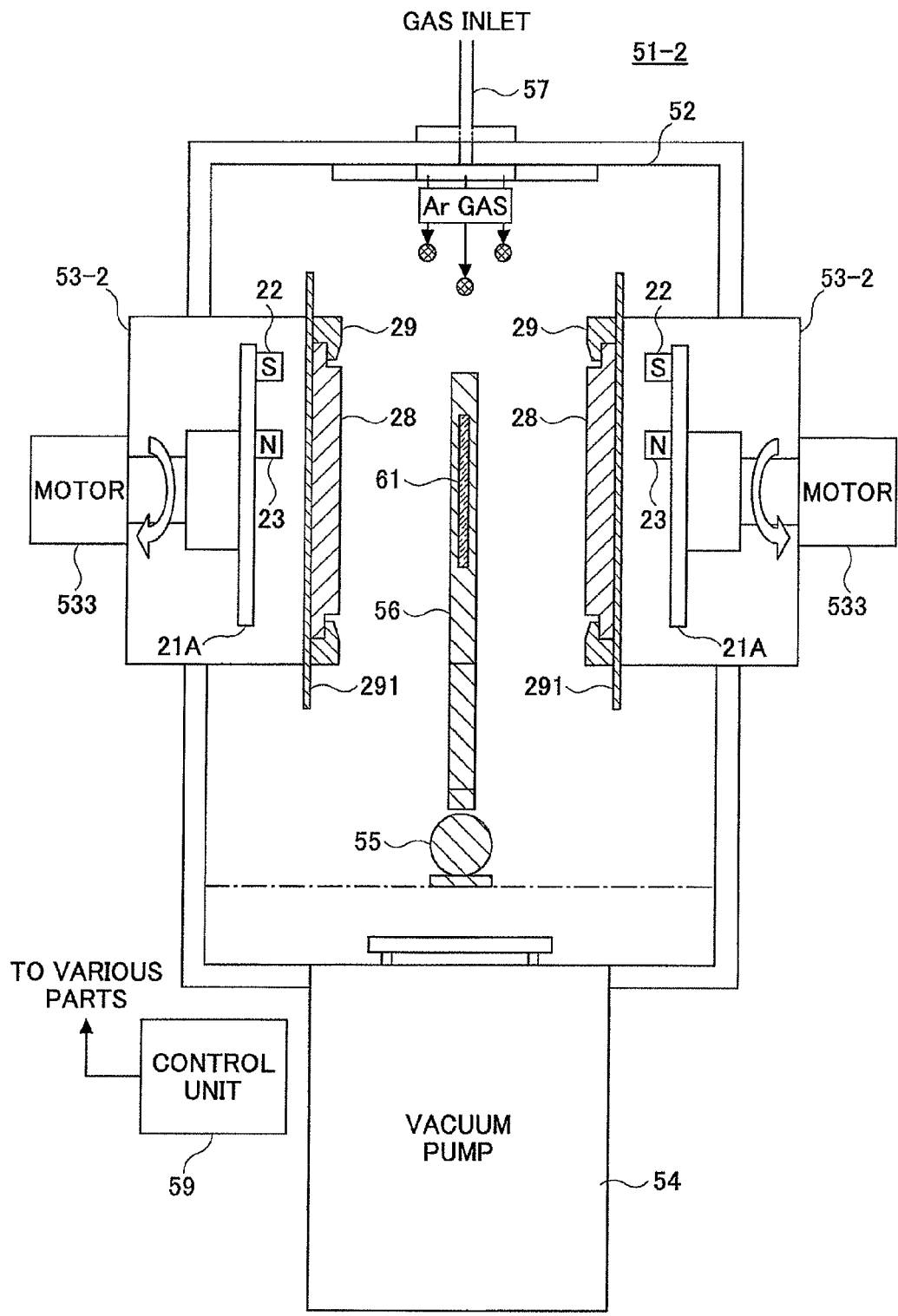
FIG. 10 is a cross sectional view showing a sputtering apparatus in a second embodiment of the present invention.

FIG. 10 is a cross sectional view showing a sputtering apparatus in a second embodiment of the present invention. In FIG. 10, those parts that are the same as those corresponding parts in FIGS. 4, 6 and 8 are designated by the same reference numerals, and a description thereof will be omitted.

A sputtering apparatus 51-2 shown in FIG. 10 includes a vacuum chamber 52 with two rotary cathode magnet parts 53-2, and a vacuum pump 54. The two rotary cathode magnet parts 53-2 have the same structure, and includes a motor 533 which rotates a magnet base 22. Magnets 22 and 23 are fixed on a magnet base 21A.

Figure 11:
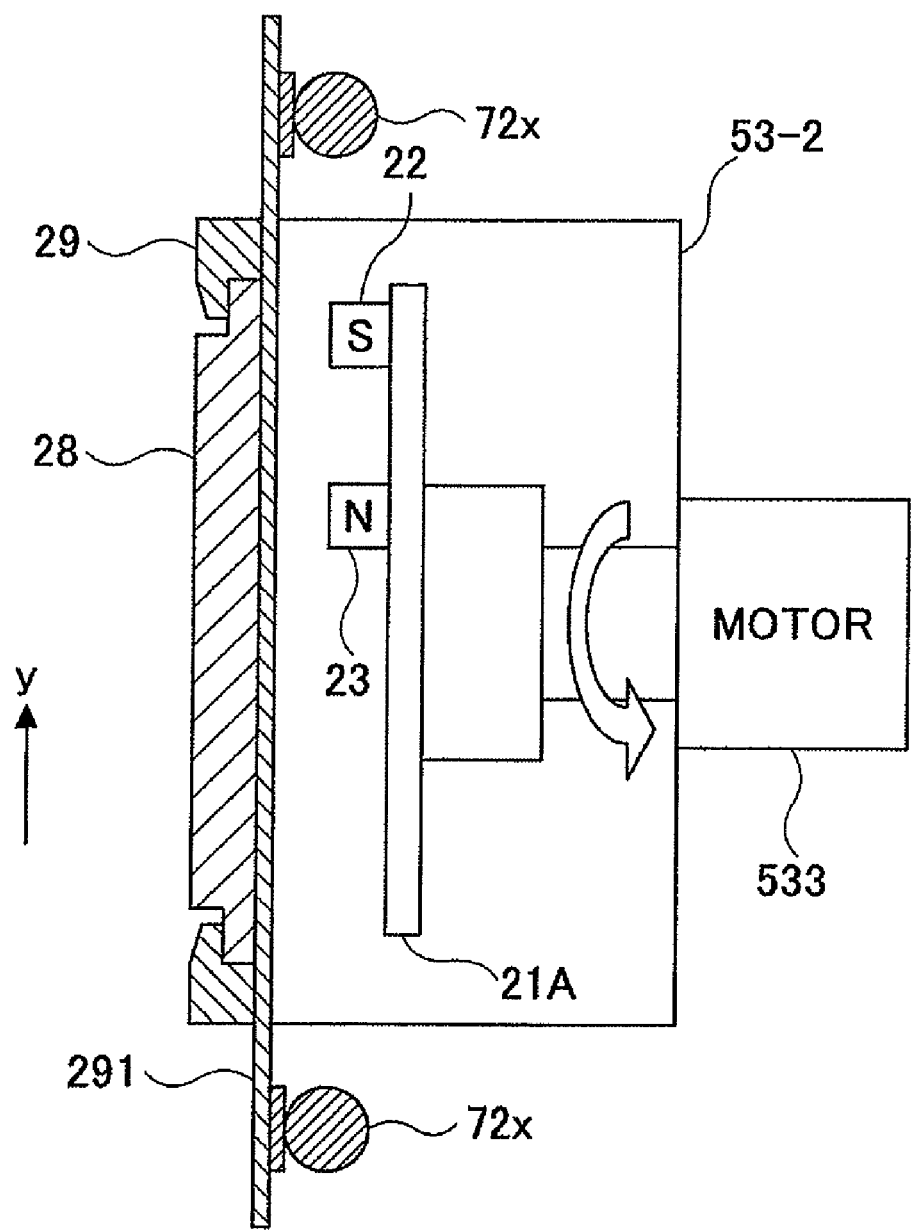
FIG. 11 is a diagram showing a target part of FIG. 10 on an enlarged scale.
Figure 12:
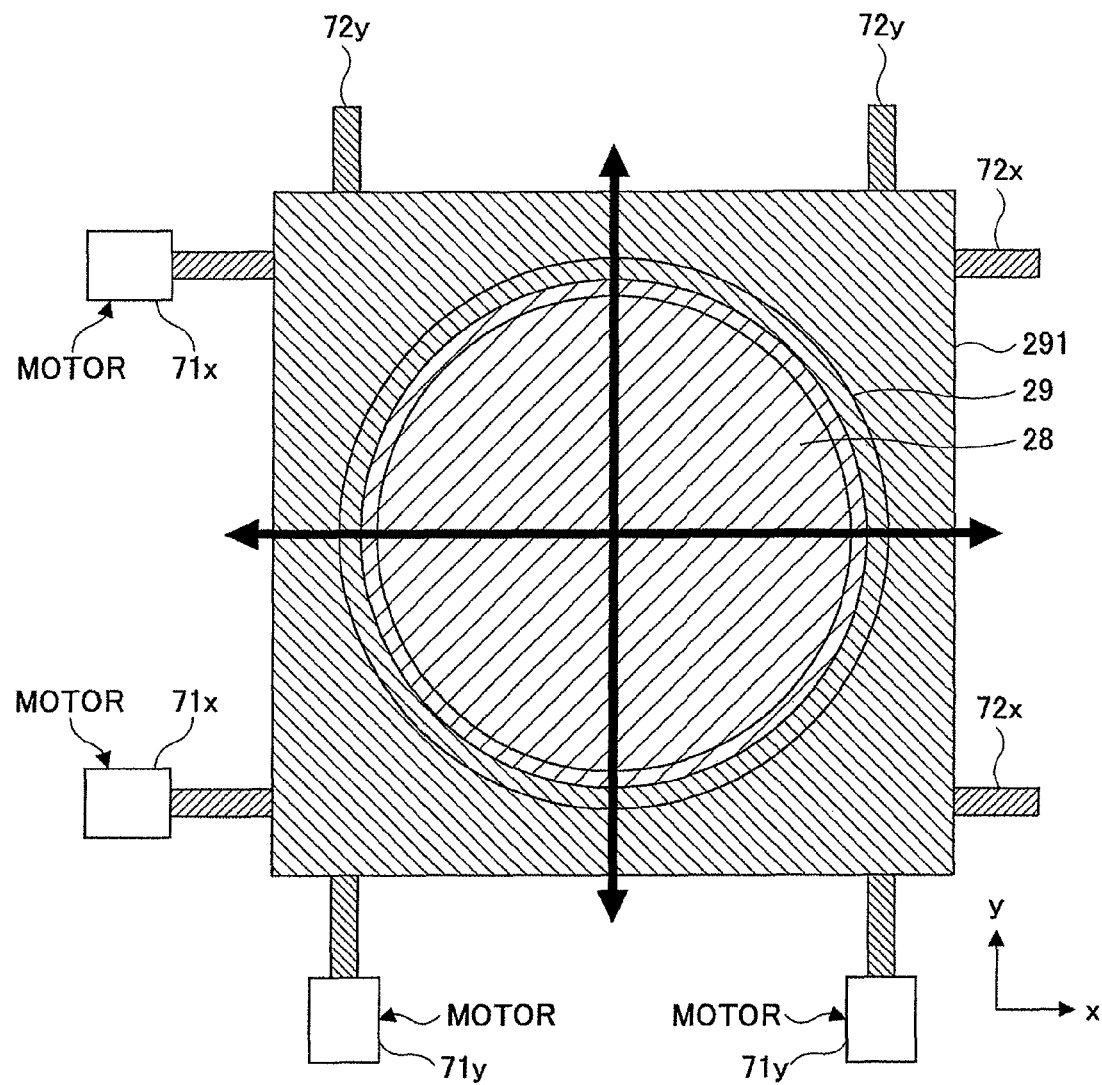
FIG. 12 is a diagram showing a target holding part of FIG. 10 on an enlarged scale.

FIG. 11 is a diagram showing a target part in the right rotary cathode magnet part 53-2 of FIG. 10 on an enlarged scale. In addition, FIG. 12 is a diagram showing a target holding part including the target holder 29 of FIG. 10 on an enlarged scale. The target holder 29 is provided on a movable shield base 291. The shield base 291 is movable with respect to the magnet base 21A in an x-direction by a pair of motors 71x and a pair of moving mechanisms 72x, and is movable with respect to the magnet base 21A in a y-direction by a pair of motors 71y and a pair of moving mechanisms 72y. Of course, the shield base 291 may be constructed to be movable in only one of the x-direction and the y-direction. The motors 71x and 71y are controlled by the control unit 59.

Figure 13:
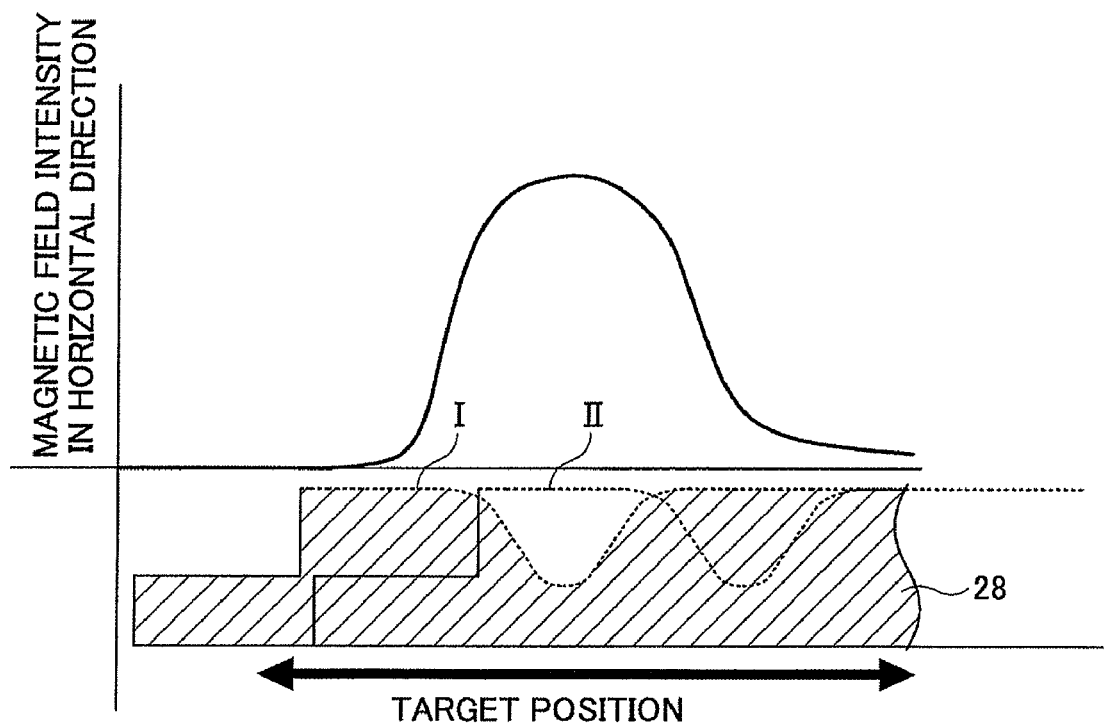
FIG. 13 is a diagram showing the intensity of the magnetic field parallel to the target surface and moving of the target.

FIG. 13 is a diagram showing the intensity of the magnetic field parallel to the target surface and moving of the target 28. In FIG. 13, the ordinate indicates the magnetic field intensity in the horizontal direction in arbitrary units, and the abscissa indicates the position of the target 28 in arbitrary units. The left side of FIG. 13 corresponds to the outer peripheral part of the target 28. In the operating state of the sputtering apparatus 51-2, the control unit 59 controls the motors 71x and 71y so that the target 28 confronts the magnets 22 and 23 at a position I shown in FIG. 13. In the idle state of the sputtering apparatus 51-2, the control unit 59 controls the motors 71x and 71y so that the target 28 confronts the magnets 22 and 23 at a position II shown in FIG. 13. At the position II, the magnets 22 and 23 confront the outer peripheral part of the target 28. As a result, the intensity of the magnetic field parallel to the target surface is controlled so that the intensity when the target 28 is at the position II is the same as the intensity when the target 28 is at the position I. In other words, during the idle state, the outer peripheral part of the target 28 and the parts other than the target 28, such as the target holder 29, are subjected to the sputtering. Therefore, it is possible to remove the redeposited film which is formed during the operating state on the outer peripheral part of the target 28 and the parts other than the target 28, such as the target holder 29. The redeposited film that is removed during the idle state is exhausted outside the sputtering apparatus 51-2 by an exhaust process or the like performed before the next operating state. Hence, it is possible to prevent the removed redeposited film from affecting the film deposition on the substrate 61 during the next operating state.

In this embodiment, even if the redepositing film is deposited on the surfaces of the target 28 and the target holder 29 during the operating state, the redeposited film is removed during the idle state of the sputtering apparatus 51-2. Because the redeposited film is removed, it is possible to prevent delamination of the redeposited film. By preventing the delamination of the redeposited film, it is possible to prevent a component of the redeposited film from adhering on the substrate 61 to cause a defect or, to prevent a cathode from becoming short-circuited to the ground within the vacuum chamber 52 and cause an operation failure of the sputtering apparatus 51-2.

This application claims the benefit of a Japanese Patent Application No. 2008-140120 filed May 28, 2008, in the Japanese Patent Office, the disclosure of which is hereby incorporated by reference.

Further, the present invention is not limited to these embodiments, but various variations and modifications may be made without departing from the scope of the present invention.

What is claimed is:

1. A sputtering method for depositing a film on a substrate, comprising:
    controlling a magnetic field parallel to a surface of a target so that the magnetic field at a part of the target, other than parts of the target which are sputtered during a deposition mode in which a deposition process is performed with respect to the substrate, has an intensity lower than an arbitrary intensity at the other parts during the deposition mode and has an intensity higher than or equal to the arbitrary intensity during a standby mode in which the deposition process is not performed; and
    removing a redeposited film which is deposited on the part of the target during the deposition mode by performing a sputtering during the standby mode.

2. The sputtering method as claimed in claim 1, wherein the intensity lower than the arbitrary intensity during the deposition mode is such that the magnetic field does not leak from the target.

3. The sputtering method as claimed in claim 1, wherein:
    the target has a disk shape and the magnetic field is generated with respect to the target by first, second and third magnets which are provided on a rotatable magnet base and are arranged from an outer periphery towards an inner periphery of the disk shape; and
    said controlling moves the first magnet away from the target and the second and third magnets closer to the target during the deposition mode in order to control the magnetic field generated by the first and second magnets to the intensity lower than the arbitrary intensity, and moves the first and second magnets closer to the target and moves the third magnet away from the target in order to control the magnetic field generated by the first and second magnets to the intensity higher than or equal to the arbitrary intensity.

4. The sputtering method as claimed in claim 2, wherein:
    the target has a disk shape and the magnetic field is generated with respect to the target by first, second and third magnets which are provided on a rotatable magnet base and are arranged from an outer periphery towards an inner periphery of the disk shape; and
    said controlling moves the first magnet away from the target and the second and third magnets closer to the target during the deposition mode in order to control the magnetic field generated by the first and second magnets to the intensity lower than the arbitrary intensity, and moves the first and second magnets closer to the target and moves the third magnet away from the target in order to control the magnetic field generated by the first and second magnets to the intensity higher than or equal to the arbitrary intensity.

5. The sputtering method as claimed in claim 3, wherein the first and third magnets are movably provided on the magnet base, and the second magnet is fixedly provided on the magnet base.

6. The sputtering method as claimed in claim 4, wherein the first and third magnets are movably provided on the magnet base, and the second magnet is fixedly provided on the magnet base.

7. The sputtering method as claimed in claim 1, wherein:
the target has a disk shape and the magnetic field is generated with respect to the target by first and second magnets which are provided on a rotatable magnet base and are arranged from an outer periphery towards an inner periphery of the disk shape; and
said controlling moves the target during the standby mode to a position such that the first and second magnets confront a part of the target more towards an outer peripheral part of the target than during the deposition mode.

8. The sputtering method as claimed in claim 2, wherein:
the target has a disk shape and the magnetic field is generated with respect to the target by first and second magnets which are provided on a rotatable magnet base and are arranged from an outer periphery towards an inner periphery of the disk shape; and
said controlling moves the target during the standby mode to a position such that the first and second magnets confront a part of the target more towards an outer peripheral part of the target than during the deposition mode.

9. A sputtering apparatus for depositing a film on a substrate, comprising:
a target holder configured to hold a target, which has a disk shape, within a vacuum chamber;
a rotatable magnet base having first, second and third magnets which are configured to generate a magnetic field and are arranged from an outer periphery towards an inner periphery of the disk shape; and
a control unit configured to control a magnetic field parallel to a surface of the target so that the magnetic field at a part of the target, other than parts of the target which are sputtered during a deposition mode in which a deposition process is performed with respect to the substrate, has an intensity lower than an arbitrary intensity at the other parts during the deposition mode and has an intensity higher than or equal to the arbitrary intensity during a standby mode in which the deposition process is not performed,
wherein a redeposited film which is deposited on the part of the target during the deposition mode is removed by performing a sputtering during the standby mode.

10. The sputtering apparatus as claimed in claim 9, wherein the control unit controls the intensity lower than the arbitrary intensity during the deposition mode to an intensity such that the magnetic field does not leak from the target.

11. The sputtering apparatus as claimed in claim 9, wherein the first and third magnets are movably provided on the magnet base, and the second magnet is fixedly provided on the magnet base.

12. The sputtering apparatus as claimed in claim 10, wherein the first and third magnets are movably provided on the magnet base, and the second magnet is fixedly provided on the magnet base.

13. A sputtering apparatus for depositing a film on a substrate, comprising:
a target holder configured to hold a target, which has a disk shape, within a vacuum chamber;
a rotatable magnet base having first and second magnets which are configured to generate a magnetic field and are arranged from an outer periphery towards an inner periphery of the disk shape; and
a control unit configured to control a magnetic field parallel to a surface of the target so that the magnetic field at a part of the target, other than parts of the target which are sputtered during a deposition mode in which a deposition process is performed with respect to the substrate, has an intensity lower than an arbitrary intensity at the other parts during the deposition mode and has an intensity higher than or equal to the arbitrary intensity during a standby mode in which the deposition process is not performed,
wherein a redeposited film which is deposited on the part of the target during the deposition mode is removed by performing a sputtering during the standby mode.

14. The sputtering apparatus as claimed in claim 13, wherein the control unit moves the target during the standby mode to a position such that the first and second magnets confront a part of the target more towards an outer peripheral part of the target than during the deposition mode.

* * * * *